United States Patent [19]

Kitamura et al.

[11] Patent Number: 4,650,700
[45] Date of Patent: Mar. 17, 1987

[54] METHOD FOR SURFACE TREATMENT OF METAL BLANKS

[75] Inventors: Yoichi Kitamura; Hisashi Hotta, both of Yokohama, Japan

[73] Assignee: Toyo Seikan Kaisha, Ltd., Tokyo, Japan

[21] Appl. No.: 786,520

[22] Filed: Oct. 11, 1985

[51] Int. Cl.$^4$ .............................................. C23C 16/00
[52] U.S. Cl. ..................... 427/255.6; 204/29; 204/38.7; 204/140; 427/318; 427/319; 427/386; 427/405; 427/410
[58] Field of Search ............... 427/255.6, 386, 327, 427/410, 405, 318, 319; 204/23, 51, 140, 30, 32.1, 29, 33, 34, 38.7

[56] References Cited

U.S. PATENT DOCUMENTS

| | | | |
|---|---|---|---|
| 3,161,530 | 12/1964 | Strobel | 427/255.6 |
| 3,921,847 | 11/1975 | Rentmeester | 427/410 |
| 4,410,581 | 10/1983 | Nam | 427/255.6 |
| 4,543,275 | 9/1985 | Akashi et al. | 427/255.6 |

FOREIGN PATENT DOCUMENTS 60-97075  5/1985  Japan ................................. 427/410

Primary Examiner—Sadie L. Childs
Attorney, Agent, or Firm—Sherman and Shalloway

[57] ABSTRACT

Surface treatment of metal blanks is achieved by applying an oxirane ring-containing compound in the gas phase to the surface of a metal blank maintained at a high temperature. According to this method, a covering layer which is much thinner than a conventional so-called adhesive primer coating layer and has a thickness of the angstrom order is formed on the surface of a metal blank. If a thermoplastic resin layer is coated on the metal surface treated with this oxirane ring-containing compound, the initial adhesion and the adhesion after lapse of time are highly improved over these adhesions attainable by the conventional methods. Even if a lacquer containing a thermosetting resin instead of the thermoplastic resin is coated and dried on the metal surface treated with this bonding compound, a similar effect can be attained. Accordingly, when an organic material is bonded or laminated to the so-treated metal surface or when metal-to-metal bonding is performed, a strong bonding can be maintained in the bonded portion.

13 Claims, No Drawings

METHOD FOR SURFACE TREATMENT OF METAL BLANKS

BACKGROUND OF THE INVENTION (1) Field of the Invention

The present invention relates to a technique of applying a newly found bonding molecule, capable of bonding tightly to the surface of a metal, to the surface treatment of metal blanks. More specifically, the present invention provides a method for forming on the surface of a metal a covering layer having a thickness of the angstrom order, which is much smaller than the thickness of a covering layer formed by a conventional so-called adhesive primer.

It was found that if a thermoplastic resin layer is coated on the metal surface treated with this bonding molecule, the initial adhesion and the adhesion after the lapse of time are highly improved over these adhesions attainable by the conventional methods. Even if a lacquer containing a thermosetting resin instead of the thermoplastic resin is coated and dried on the metal surface treated with this bonding molecule, a similar effect can be attained. Accordingly, when an organic material is bonded or laminated to the so-treated metal surface or when metal-to-metal bonding is performed, a strong bonding can be maintained in the bonded portion.

(2) Description of the Prior Art

A desire to form a strong bonding by heating between a metal and a thermoplastic resin layer is very strong in various fields.

For example, in the field of the can-manufacturing industry, there is broadly adopted a method for forming a can body by lapping both the end portions of a metal blank for a can body through a thermoplastic adhesive such as a polyamide adhesive and heat-bonding the lapped end portions. When metal blanks are thus bonded together through a thermoplastic adhesive, the bonding strength between the surface of the metal blank and the thermoplastic adhesive is not always high even just after the bonding operation and the bonding strength tends to decrease with the lapse of time. As means for eliminating this defect, there is ordinarily adopted a method in which an adhesive primer such as an epoxy-phenolic resin is coated on a metal blank and is baked and a thermoplastic resin adhesive is heat-bonded through this adhesive primer layer.

However, the epoxy-phenolic lacquer is relatively expensive and the operation of forming a coating layer of this lacquer on the metal blank is troublesome. Moreover, since the lacquer has to be applied in the form of a solution in an organic solvent, the solvent cost and the energy cost for baking become necessary. Furthermore, since discharge of the organic solvent into the open air is not allowed, an environmental pollution-preventing device such as an after-burner should be provided.

Strong bonding between a thermoplastic resin and a metal blank is eagerly desired also in the field of film-laminated steel plates as substitutes for conventional coated steel plates, and also in this case, the above-mentioned defects are similarly observed.

SUMMARY OF THE INVENTION

It is therefore a primary object of the present invention to provide a method for the surface treatment of metal blanks, in which the bonding or adhesion between a metal blank and a thermoplastic resin layer can be enhanced only by applying a very simple operation to the surface of the metal blank.

Another object of the present invention is to provide a method for the surface treatment of metal blanks, in which degradation of the bonding strength with the lapse of time, which is observed when a conventional adhesive primer is applied to the surface of a metal blank, is prominently moderated.

Still another object of the present invention is to provide a treatment method in which the heat bondability of a thermoplastic resin layer to a metal is improved only by forming a treatment layer which is much thinner than a layer of a conventional adhesive primer according to a very simple operation.

More specifically, in accordance with the present invention, there is provided a method for the surface treatment of metal blanks, which comprises applying an oxirane ring-containing compound in the gas phase to the surface of a metal blank maintained at a high temperature.

DETAILED DESCRIPTION OF THE PREFERRED EMBODIMENTS

The present invention will now be described in detail.

The treating agent used in the present invention has a chemical structure characterized in that an oxirane ring, that is, a group

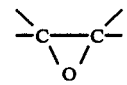

is present in the molecule and a hydroxyl group derived from this oxirane ring is contained in the molecule.

When this oxirane ring-containing compound is applied in the form of a vapor to the surface of a metal blank maintained at a high temperature, the strength of adhesion to a resin layer, especially the adhesion strength after the lapse of time, is prominently improved. Moreover, this improvement of the adhesion strength can be attained by formation of a very thin coating layer having a thickness of several angstroms to scores of angstroms, which cannot be expected at all in a conventional adhesive primer.

For example, in case of the seam of a can body formed by heat-bonding the lapped end portions of an aluminum plate through a nylon type adhesive, the initial bonding strength is about 0.5 to about 1.0 kg/cm. In contrast, when the surface of an aluminum plate is heated and treated with a vapor of an epoxy resin (Epon #828 supplied by Shell Chemical) to form a covering layer having a thickness of about 15 Å and this treated aluminum plate is formed into a can body in the same manner as described above, the bonding strength is improved and increased to a level of 5.0 to 6.0 kg/cm, which is about 7 times the above-mentioned bonding strength. Moreover, in the case where an untreated aluminum plate is used, the bonding strength is reduced substantially to zero after the lapse of 1 to 2 days. On the other hand, in case of an aluminum plate which is subjected to the surface treatment according to the present invention, the bonding strength is maintained at a level of at least 2 kg/cm even after the lapse of 1 to 2 days.

When degradation of the bonding between the surface of a metal and a covering layer formed thereon with the lapse of time is considered, not only the factor of adhesion of the bonded portion but also the factor of water resistance of the bonded portion should be taken into account. The reason why a high initial bonding strength and a high resistance to degradation of the bonding strength with the lapse of time can be attained by the surface treatment of the present invention has not been completely elucidated, but it is considered that when a vapor of an oxirane ring-containing compound is applied to the surface of a metal maintained at a high temperature, certain chemical coupling will be caused between them and the above-mentioned improvement will be attained by this chemical coupling.

The surface-treating agent used in the present invention contains at least one oxirane ring in the molecule, and at a high temperature, the surface-treating agent is vaporized and can be deposited on the surface of a metal blank maintained at a high temperature.

Suitable examples of the surface-treating agents are described below, though surface-treating agents that can be used in the present invention are not limited to those exemplified below.

(1) Bisepoxides and polyepoxides such as bisphenol A-bisepoxide, other epoxy resins derived from bisphenols or other polyhydric phenols and epihalohydrins, polyethylene glycol bisepoxide, epoxidized polybutadiene and other epoxy resins.

(2) Epoxidized glycerides such as epoxidized soybean oil, epoxidized castor oil, epoxidized linseed oil and epoxidized safflower oil.

(3) Epoxidized fatty acid esters such as epoxidized butyl ester of linseed oil fatty acid, epoxidized octyl oleate, epoxidized iso-octyl oleate and epoxidized 2-ethylhexyl oleate.

(4) Epoxyhexahydrophthalic acid esters represented by the following formula:

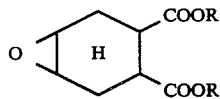

wherein R stands for a higher alkyl group such as a 2-ethylhexyl group or an isododecyl group.

(5) 3-(2-Xenoxy)-1,2-epoxypropane, styrene oxide, vinylcyclohexene oxide, glycidyl acrylate, glycidyl phthalate and phenylglycidyl ether.

From the viewpoint of the operation adaptability to the surface treatment, it is preferred that the oxirane ring-containing compound used in the present invention should have a number average molecular weight of 330 to 900. In view of the effect of improving the adhesion, it is preferred that the epoxy equivalent value be 170 to 500.

An oxirane ring-containing compound which is easily available and has a high surface-treating effect is a liquid or low-melting-point (below 74° C.) epoxy resin which is composed mainly of a chemical structure represented by the following general formula:

A metal blank having a shape of a foil, sheet or plate may be surface-treated according to the present invention. For example, iron plates, steel plates and soft iron plates, stainless steel plates, and plates of light metals such as aluminum plates, copper plates and brass plates, deposited plates formed by hot dipping or electrodepositing different metals such as tin, zinc, copper, chromium, nickel and aluminum on these metal plates, chemically treated plates formed by treating the surface of these metal plates with chromic acid and/or phosphoric acid chemically or by cathodic electrolysis, and plates formed by subjecting these plates to the anodic treatment can be surface-treated according to the present invention. Of course, iron foils, steel foils, aluminum foils, copper foils, metal foils treated with phosphoric acid and/or chromic acid, and iron foils and steel foils deposited with tin, zinc, copper, chromium, nickel or the like can be treated according to the present invention.

In the present invention, as is illustrated in the examples given hereinafter, if a metal blank having the surface treated with chromic acid chemically or by cathodic electrolysis is used, the initial bonding strength and the resistance to degradation of the bonding strength with the lapse of time can be highly improved.

In view of the initial bonding force to the thermoplastic resin layer and the resistance to degradation of the bonding force with the lapse of time, in the present invention, it is important that an oxirane ring-containing compound should be applied in the gas phase to the surface of a metal blank maintained at a high temperature. For example, when an oxirane ring-containing compound is applied to the surface of a metal blank by such means as spray coating, the obtained bonding force is less than ⅓ of the bonding force obtainable when the oxirane ring-containing compound is applied in the form of a vapor. According to the present invention, by applying the oxirane ring-containing compound in the form of a vapor to the surface of the metal blank, the adhesion-reinforcing effect can be attained if only the oxirane ring-containing compound is applied in a much smaller thickness than that of a conventional coating, that is, 1 to 100 Å, especially 1 to 30 Å. Incidentally, the thickness is determined according to the following method.

The intensity of the carbon 1S photoelectron spectrum as the constituent element of the treatment film on the treated metal surface is determined by the electron spectroscopy for chemical analysis (hereinafter referred to as "ESCA") and is compared with the intensity of a reference sample formed by vacuum deposition of carbon, and the film thickness is calculated by the formula given below. Incidentally, since an organic substance adheres to the metal surface, a blank test is carried out in advance and the treatment thickness is determined by subtracting the thickness of the organic substance.

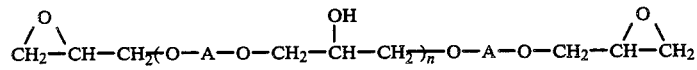

wherein A stands for a divalent aromatic hydrocarbon residue derived from a polyhydric phenol such as bisphenol A,
and has an epoxy equivalent value of 170 to 500.

$$x = -\lambda_c \sin\theta \cdot l_n\left(1 - \frac{I_c}{I_c^s}\right) (\rho_c^s/\rho_c)$$

wherein x stands for the thickness of the organic layer, $I_c^s$ stands for the intensity of the carbon 1S spectrum of vacuum-deposited carbon, $I_c$ stands for the intensity of the carbon 1S spectrum of the sample, $\rho_c^s$ stands for the atomic concentration of vacuum-deposited carbon, which is 0.1875 mole/cm$^3$, $\rho_c$ stands for the atomic concentration of carbon of the sample (organic compound), which is 0.0654 mole/cm$^3$, $\theta$ stands for the photoelectron exit angle, which is 90° (hence, sin $\theta$ is equal to 1), and $\lambda_c$ stands for the average photoelectron escape depth, which is 18.1 Å.

From the viewpoint of the bonding force, it is important that the surface of the metal blank should be maintained at a high temperature. If this temperature is too low, the bonding force to the thermoplastic resin layer is much smaller than that attainable according to the present invention.

When the treatment with the oxirane ring-containing compound is carried out according to the present invention, it is preferred that the surface of the metal blank be maintained at a temperature higher than 150° C., especially 180° to 300° C., particularly especially 200° to 250° C. If the temperature is below the above range, the degree of improvement of the bonding force is lower than the improvement degree attainable when the temperature is within the above-mentioned range. A preferred temperature differs according to the kind of the oxirane ring-containing compound, and in case of a compound having a higher molecular weight, a higher temperature is adopted.

Various means may be adopted for applying the oxirane ring-containing compound in the gas phase to the surface of the metal blank. According to a simplest method, an oxirane ring-containing compound is placed in an atmosphere maintained at a high temperature and a metal blank is exposed to the atmosphere filled with the vapor of the oxirane ring-containing compound. Of course, the oxirane ring-containing compound may be used singly, or a mixture of two or more of oxirane ring-containing compounds may be used. The oxirane ring-containing compound may be supplied in the form of a bulk, that is, in the non-diluted state, to the high-temperature atmosphere, or it may be supplied in the diluted state, that is, in the form of a solution, emulsion or suspension in water or an organic solvent. Moreover, the oxirane ring-containing compound may be supplied into the high-temperature atmosphere in the surface area-increased state by supporting the compound on an inorganic pigment or filler or gel particles or glass beads. In short, in the present invention, in connection with the oxirane ring-containing compound, the shape and composition are not particularly critical, so far as a vapor of the compound can be generated. For example, if an oxirane ring-containing compound is incorporated in a lacquer solution to be coated on one surface of a metal plate or metal foil and a number of one-surface-coated metal plates or foils are arranged at small intervals in a high-temperature atmosphere so that coated surfaces confront the uncoated surfaces of adjacent metal plates or foils, the uncoated surfaces can be treated with a vapor of the oxirane ring-containing compound.

This treatment can be performed batchwise or in the continuous manner. For example, the treatment can be accomplished by supplying a coil-like or sheet-like metal foil or metal plate continuously into a tunnel-type heat treatment furnace where the vapor treatment is carried out. Moreover, there may be adopted a method in which a certain quantity of a metal blank is introduced into a treatment furnace, the treatment furnace is then sealed and a vapor of the oxirane ring-containing compound is filled in the treatment furnace.

In each case, hot air containing a vapor of the oxirane ring-containing compound may be prepared outside or within the treatment furnace and the vapor treatment may be accomplished by circulating this hot air in the treatment furnace.

The time required for the gas phase treatment with the oxirane ring-containing compound depends on the vapor concentration in the gas phase and the temperature, and it is sufficient if a covering layer having the above-mentioned thickness is formed and an optional time can be adopted according to the treatment temperature and vapor concentration conditions. The thickness of the covering layer is very small. Even if a covering layer having a thickness exceeding the above-mentioned range is formed, no particular advantage can be attained. Therefore, even if the treatment time is longer than 10 minutes, no particular advantage is attained but the treatment becomes economically disadvantageous.

The surface treatment method of the present invention is especially effective for promoting the adhesion or bonding of a thermoplastic resin to be coated on the surface of a metal blank, such as a polyamide, a polyester, an acid-modified polyolefin, an acrylic resin, a vinyl resin or a polycarbonate resin.

Ordinarily, the surfaces of metal blanks as described above are treated with various oiling agents such as dioctyl sebacate and cotton seed oil. The surface treatment of the present invention may be performed on a metal blank having a layer of an oiling agent as described above, or the surface treatment of the present invention may be carried out after the oiling agent layer has been removed by a degreasing treatment.

The present invention will now be described in detail with reference to the following examples that by no means limit the scope of the invention.

EXAMPLE 1

The surface of commercially available DR-8 tin-free steel having a plate thickness of 0.17 mm (Hitop ® supplied by Toyo Kohan; having a deposited metallic chromium amount of 105 mg/dm$^2$ and a deposited chromium oxide amount of 14 mg/dm$^2$ calculated as chromium) was coated in the gas phase with Epikote #828 ® or Epikote #1001 ® (supplied by Shell Chemical) according to the following method.

A lidded cylindrical metal vessel having a diameter of about 150 mm and a height of about 150 mm was prepared, and about 1 g of the resin was placed in the bottom portion of the metal vessel and a small piece of tin-free steel was simultaneously placed in the vessel in the state supported by a glass holder so that the steel piece did not fall in contact with the resin. Then, the metal vessel was closed and placed in an electric oven, and heating was carried out at 210° C. for 10 minutes. Then, the metal vessel was taken out from the oven and cooled, and the tin-free steel piece was taken out and the coating thickness was measured. Separately, two samples having a size of 5 mm×70 mm were cut out from this steel piece and the samples were bonded to each other through a polyamide type adhesive (nylon 12 film having a thickness of 80 μm supplied by Toray) being interposed therebetween, and the T-peel strength was measured.

The obtained results are shown in Table 1.

TABLE 1

| Kind of Epoxy Compound | Properties of Epoxy Compound | | | Thickness (Å) | T-Peel Strength (kg/cm) |
|---|---|---|---|---|---|
| | Epoxy Equivalent | Melting Point | Number Average Molecular Weight | | |
| Epikote #828 ® | 184–194 | liquid | 370 | 18 | 8.6 |
| Epikote #1001 ® | 450–500 | 64–74° C. | 900 | 8 | 8.2 |
| blank* (comparison) | — | — | — | 0 | 2.4 |

Note
*sample prepared in the same manner as in Example 1 except the compound was not used at all (the same will apply in the examples given hereinafter)

EXAMPLE 2

The treatment and measurement were carried out in the same manner as described in Example 1 except that a commercially available can lid material 5052 (treated with Alodine 401-45 ® and having a surface chromium material of 18 mg/dm² calculated as chromium) having a plate thickness of 0.30 mm was used. The obtained results are shown in Table 2.

TABLE 2

| | Thickness (Å) | T-Peel Strength (kg/cm) |
|---|---|---|
| Epikote #828 ® | 15 | 5.4 |
| Epikote #1001 ® | 8 | 7.2 |
| Blank (comparison) | 0 | 0.8 |

EXAMPLE 3

The surface of commercially available DR-8 tin-free steel having a plate thickness of 0.17 mm (Cansuper ® supplied by Nippon Steel Corporation; having a deposited metallic chromium amount of 112 mg/dm² and a deposited chromium oxide amount of 12 mg/dm² calculated as chromium) or a commercially available can lid material 5052 having a plate thickness of 0.30 mm (treated with Alodine 401-45 ® and having a surface chromium amount of 18 mg/dm² calculated as chromium) was coated in the gas phase with Epikote #828 ® (supplied by Shell Chemical) in the same manner as described above, and then, samples for the measurement of the T-peel strength were prepared. Each sample was immersed in a 0.4% aqueous solution of citric acid maintained at 90° C. The degradation of the adhesion strength was examined by measuring the T-peel strength before the immersion and after 1 day, 2 days, 3 days, 5 days and 7 days, respectively.
The obtained results are shown in Table 3.

EXAMPLE 4

Samples were prepared in the same manner as described in Example 1 except that the coating thickness was changed by changing the amount of the epoxy compound charged in the bottom portion of the metal vessel or repeating the gas phase coating, and the bonding force was examined by measuring the T-peel strength. The obtained results are shown in Table 4.

TABLE 4

| Thickness (Å) | T-Peel Strength (Kg/cm) |
|---|---|
| 0 | 2.4 |
| 3 | 6.8 |
| 14 | 8.4 |
| 18 | 8.6 |
| 27 | 7.2 |
| 43 | 5.4 |
| 87 | 4.5 |

EXAMPLE 5

Samples were prepared in the same manner as described in Example 1 except that the gas phase coating temperature was changed. The bonding force was examined by measuring the T-peel strength.
The obtained results are shown in Table 5.

TABLE 5

| Heating Temperature | T-Peel Strength (Kg/cm) |
|---|---|
| heating was not effected | 2.0 |
| 130° C. | 3.6 |
| 150° C. | 5.2 |
| 170° C. | 7.2 |
| 190° C. | 6.8 |
| 210° C. | 8.0 |
| 250° C. | 8.6 |
| 300° C. | 6.4 |

We claim:
1. A method for improving the bondability of metal blanks to metal or to organic materials by the surface treatment of the metal blanks, which comprises vapor-depositing a layer of from 1 to 100 Å thickness of an oxirane ring-containing compound to the surface of a metal blank maintained at a high temperature thereby improving the initial bondability and bondability with lapse of time of the surface treated metal blank to metals and organic materials.

2. A method according to claim 1, wherein the oxirane ring-containing compound is applied to the surface of the metal blank maintained at a temperature higher than 150° C.

3. A method according to claim 1, wherein the oxirane ring-containing compound has a molecular weight of 330 to 900 and an epoxy equivalent value of 170 to 500.

TABLE 3

| Material | Coating Material | Thickness (Å) | Bonding Force (T-peel strength, kg/cm) | | | | | |
|---|---|---|---|---|---|---|---|---|
| | | | before immersion | after 1 day | after 2 days | after 3 days | after 5 days | after 7 days |
| TFS | #828 | 14 | 8.4 | 6.0 | 4.2 | 2.4 | 1.8 | 1.6 |
| TFS | blank (comparison) | 0 | 2.8 | 1.4 | 0.4 | 0 | — | — |
| aluminum | #828 | 16 | 5.0 | 3.4 | 2.2 | 1.2 | 1.1 | 1.0 |
| aluminum | blank (comparison) | 0 | 0.8 | 0 | — | — | — | — |

4. A method according to claim 1, wherein the oxirane ring-containing compound is a bisepoxide.

5. A method according to claim 1, wherein the oxirane ring-containing compound is a liquid or low-melting-point (lower than 74° C.) epoxy resin composed mainly of a chemical structure represented by the following general formula:

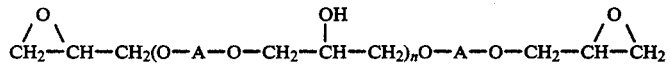

wherein A stands for a divalent aromatic hydrocarbon residue derived from a polyhydric phenol such as bisphenol A, and having an epoxy equivalent value of 170 to 500.

6. A method according to claim 1, wherein the treatment is accomplished by introducing the metal blank into a heat treatment furnace and exposing the metal blank to a high-temperature atmosphere containing a vapor of the oxirane ring-containing compound.

7. A method according to claim 1, wherein the metal blank is one having the surface treated with chromic acid chemically or by cathodic electrolysis.

8. A method for the surface treatment of metal blanks, which comprises vaporizing under atmospheric pressure a liquid epoxy compound having a molecular weight of 330 to 900 and an epoxy equivalent value of 170 to 500 and exposing the surface of a metal blank maintained at a temperature higher than 150° C. to the vapor of the liquid epoxy compound, thereby forming a covering layer of the epoxy compound at a thickness of 1 to 100 Å onto the surface of the metal blank, said covering layer being capable of tightly bonding a thermoplastic resin layer to the surface of the metal blank.

9. A method according to claim 8 wherein the liquid epoxy compound is composed mainly of a chemical structure represented by the following general formula

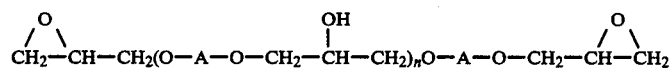

wherein A stands for a divalent aromatic hydrocarbon residue derived from a polyhydric phenol.

10. A method according to claim 8 wherein the metal blank has been surface treated with chromic acid chemically or by cathodic electrolysis.

11. A method according to claim 8 wherein the thickness of the covering layer of the epoxy compound is from 1 to 30 Å.

12. A method according to claim 8 wherein the surface of the metal blank is maintained at a temperature from 180° to 300° C. and is exposed to the vapor of the liquid epoxy compound.

13. A method according to claim 8 wherein the surface of the metal blank is maintained at a temperature from 200° to 250° C. and is exposed to the vapor of the liquid epoxy compound.

* * * * *